United States Patent [19]

Mihara et al.

[11] Patent Number: 5,418,923
[45] Date of Patent: May 23, 1995

[54] CIRCUIT FOR PRIORITIZING OUTPUTS OF AN ASSOCIATIVE MEMORY WITH PARALLEL INHIBITION PATHS AND A COMPACT ARCHITECTURE

[75] Inventors: Masaaki Mihara; Tadato Yamagata; Takeshi Hamamoto, all of Hyogo, Japan

[73] Assignee: Mitsubishi Denki Kabushiki Kaisha, Tokyo, Japan

[21] Appl. No.: 937,763

[22] Filed: Sep. 1, 1992

[30] Foreign Application Priority Data

Sep. 2, 1991 [JP] Japan .................. 3-221691
Jun. 1, 1992 [JP] Japan .................. 4-140801

[51] Int. Cl.⁶ .......................................... G11C 15/00
[52] U.S. Cl. .................................. 395/425; 365/49; 365/189.07; 365/230.06
[58] Field of Search ............. 365/49, 189.07, 230.06; 395/425

[56] References Cited

U.S. PATENT DOCUMENTS 3,913,075 10/1975 Vitalier et al. ................. 365/49
4,523,301 6/1985 Kadota et al. ................... 365/49

FOREIGN PATENT DOCUMENTS 62-132297 6/1987 Japan .

OTHER PUBLICATIONS

"An 8-kbit Content-Addressable and Reentrant Memory", by H. Kadota et al., IEEE Journal of Solid-State Circuits, vol. SC-20, No. 5, Oct. 1985, pp. 951-956.
"An Integrated Content Addressable Memory System", by Jon Patrick Wade, pp. 104-110.
"Content-Addressable Memories", by Teuvo Kohonen, vol. 1, pp. 136-143.

*Primary Examiner*—David L. Robertson
*Attorney, Agent, or Firm*—Lowe, Price, LeBlanc & Becker

[57] ABSTRACT

An encoding circuit shortens time required for a coincidence signal to be converted into an address code after selected and output sequentially according to a predetermined priority level when the coincidence signal is obtained from an associative memory. The circuit is provided with a contention arbitrating circuit for a lower subgroup and a contention arbitrating circuit for a higher subgroup. In the contention arbitrating circuit for a lower subgroup and the contention arbitrating circuit for higher subgroup, each coincidence signal simultaneously activates inhibiting signals whose priority levels are lower than the priority level of the coincidence signal. A lower half of coincidence signals are arranged in descending order in the contention arbitrating circuit for a lower subgroup and a higher half of coincidence signals are arranged in ascending order in the contention arbitrating circuit for a higher subgroup. The contention arbitrating circuit for a lower subgroup and the contention arbitrating circuit for a higher subgroup are arranged in a triangular array and a complementary triangular array, respectively.

6 Claims, 5 Drawing Sheets

CIRCUIT FOR PRIORITIZING OUTPUTS OF AN ASSOCIATIVE MEMORY WITH PARALLEL INHIBITION PATHS AND A COMPACT ARCHITECTURE

BACKGROUND OF THE INVENTION

1. Field of the Invention

The present invention relates to a priority determining circuit of an associative memory and more particularly, to a priority determining circuit of an associative memory for use in a data processing circuit in which, in response to coincidence of stored data in an associative memory with externally applied retrieval data, coincidence signals from an address of the coinciding stored data are sequentially selected and provided according to predetermined priority levels and the selected and provided coincidence signal is converted into a predetermined address code.

2. Description of the Background Art

Figure 3:
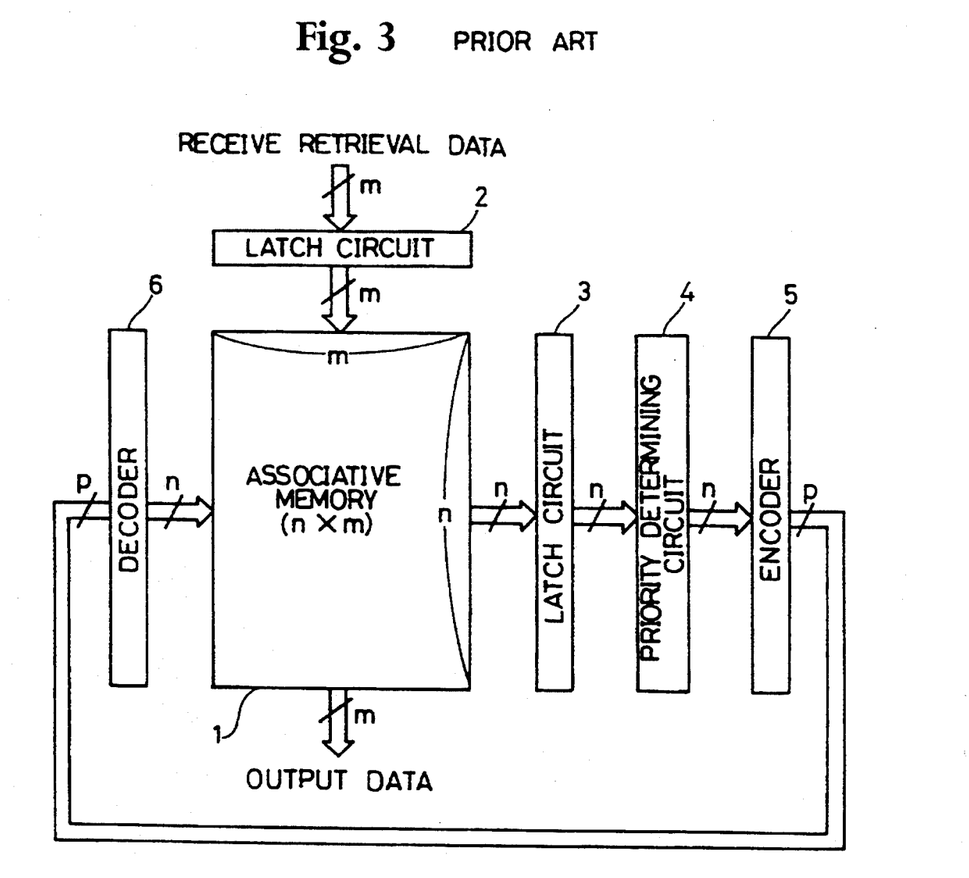
FIG. 3 is a block diagram of the whole peripheral circuitry for the conventional associative memory.

FIG. 3 is a block diagram showing a conventional example including a peripheral circuit portion for reading desired data stored in an associative memory. Referring to FIG. 3, associative memory 1 has a storage capacity of n words (1 word is m bits), that is, n×m bits. In order to retrieve data stored in associative memory 1, retrieval data having a word length of m bits is applied externally to associative memory 1 through a latch circuit 2. The retrieval data is compared with all n pieces of data stored in associative memory 1. If data coinciding with the retrieval data exists, a coincidence signal is provided from an address corresponding to a word position where the coinciding data is stored and is applied to a priority determining circuit 4 through a latch circuit 3.

Because of the characteristics of associative memory 1, plural pieces of data coinciding with the retrieval data sometimes exist in associative memory 1. In this case, a plurality of coincidence signals are provided simultaneously from associative memory 1. It is difficult to process these signals simultaneously in parallel, so that priority determining circuit 4 selects from these coincidence signals and outputs the one(s) having the highest priority.

The coincidence signal selected by priority determining circuit 4 is applied to an encoder 5 at a succeeding stage, converted into a predetermined address code (for example, a binary digit) which is then transmitted to decoder 6. Decoder 6 decodes the address code and designates one particular address for reading data from associative memory 1, so that data coinciding with the retrieval data (m bit) among data stored in associative memory 1 is read.

Figure 4:
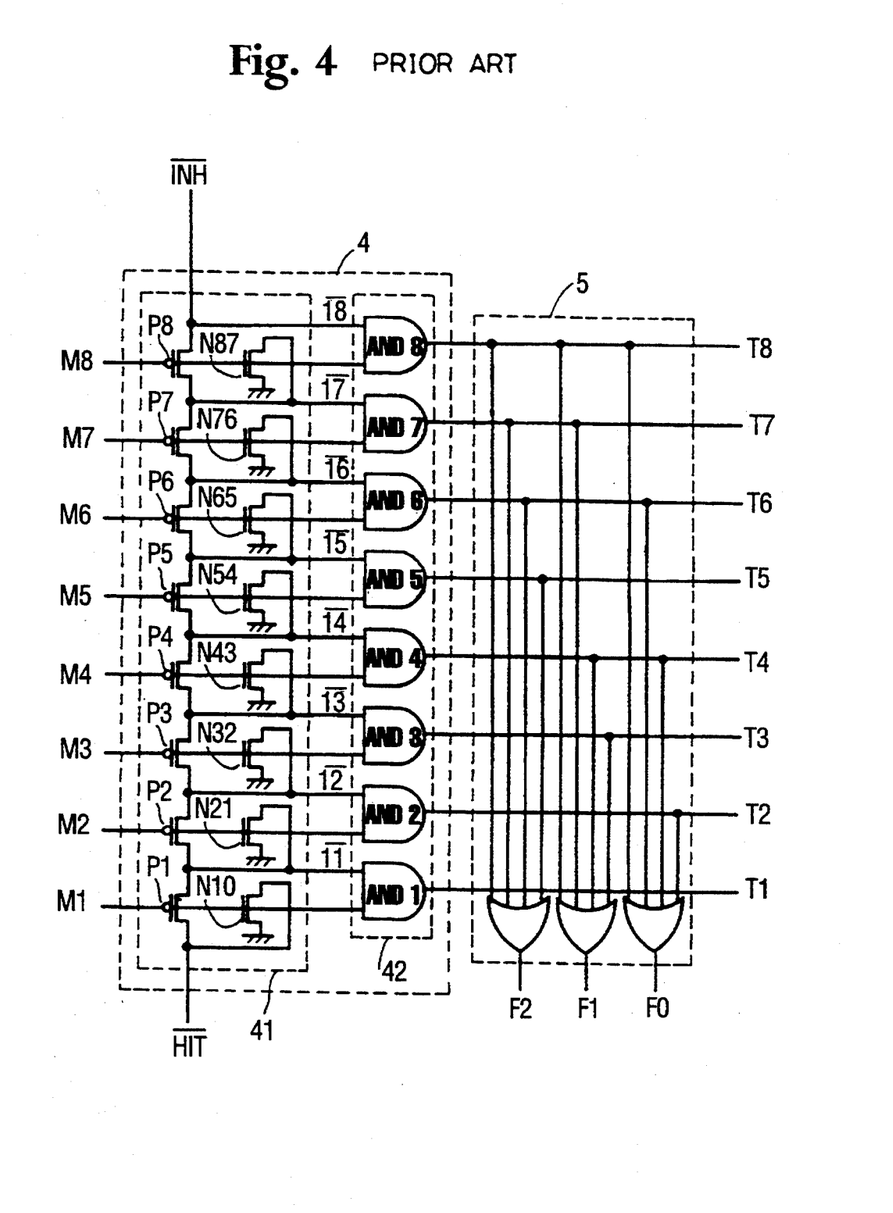
FIG. 4 is a block diagram of a conventional priority determining circuit and an encoder circuit.

FIG. 4 is a specific block diagram of the priority determining circuit and the encoder shown in FIG. 3. Referring to FIG. 4, priority determining circuit 4 includes contention arbitrating circuit 41 and signal selecting circuit 42. Contention arbitrating circuit 41 receives coincidence signals M1–M8 (in an example shown in FIG. 4, the number of words is 8) applied from latch circuit 3 shown in FIG. 3 and outputs inhibiting signals $\overline{I1}$–$\overline{I8}$.

Contention arbitrating circuit 41 includes P channel MOS transistors P1–P8 and N channel MOS transistors N10, N21, N32, N43, N54, N65, N76 and N87. P channel MOS transistors P1–P8 are connected in series. A coincidence signal Mj ($1 \leq j \leq 8$) is applied to each of the gates. A block inhibiting signal $\overline{INH}$ is applied to the drain of P channel MOS transistor P8, and a block coincidence signal $\overline{HIT}$ is provided from the source of P channel MOS transistor P1. The drain of each of P channel MOS transistors P1–P8 is connected to one terminal of each of AND gates AND1–AND8, respectively, included in signal selecting circuit 42. Each of coincidence signals M1–M8 is applied to the other input terminal of each of AND gates AND1–AND8, respectively.

Block inhibiting signal $\overline{INH}$ is a signal activating all inhibiting signals $\overline{I1}$–$\overline{I8}$ and is applied to the drain of P channel MOS transistor P8. Block coincidence signal $\overline{HIT}$ indicates at least one coincidence signal is in an active state.

In the contention arbitrating circuit 41 shown in FIG. 4, when coincidence signal M4 is in an active state, (an "H" level), N channel MOS transistor N43 is rendered conductive, and consequently inhibiting signal $\overline{I3}$ whose priority level is lower by one is activated. Consequently, even if the coincidence signal M3 attains "H" level, for example, the output of an AND gate AND 3 would be at "L" level. If coincidence signal M4 is in an inactive state ("L" level), P channel MOS transistor P4 is rendered conductive, and its own inhibiting signal $\overline{I4}$ is propagated as an inhibiting signal $\overline{I3}$ whose priority level is lower by one. If the coincidence signal M1 is active, N channel MOS transistor N10 is rendered conductive, and consequently, block coincidence signal $\overline{HIT}$ is activated to "L" level. However, if the coincidence signal M1 is at an inactive state, P channel MOS transistor P1 is rendered conductive, and inhibiting signal $\overline{I1}$ is propagated as the block coincidence signal $\overline{HIT}$. Such method of reducing delay time by inhibiting, by the gate circuit, output of the lower signal in response to the coincidence signal is disclosed in, for example, "Content-Addressable Memories" (Springer Series in Information Sciences) by Teuvo Kohnen and in "An Integrated Content Addressable Memory System" by John Patrick Wade.

Signal selecting circuit 42 receives inhibiting signals $\overline{I1}$–$\overline{I8}$ and outputs arbitration signals T1–T8. Signal selecting circuit 42 inhibits or allows output of coincidence signals M1–M8 as arbitration signals T1–T8, depending on states of inhibiting signals $\overline{I1}$–$\overline{I8}$, respectively. As a result, only one of arbitration signals T1–T8 is in an active state.

Encoder 5 includes three 4-input OR circuits, receives arbitration signals T1–T8 provided from signal selecting circuit 42 and outputs encoding signals F0–F2. Encoder 5 converts coincidence information from associative memory 1 into an address code of binary number. In the example shown in FIG. 4, the number of word is $2^3$, so that an output of 3 bits can be obtained.

Figure 5:
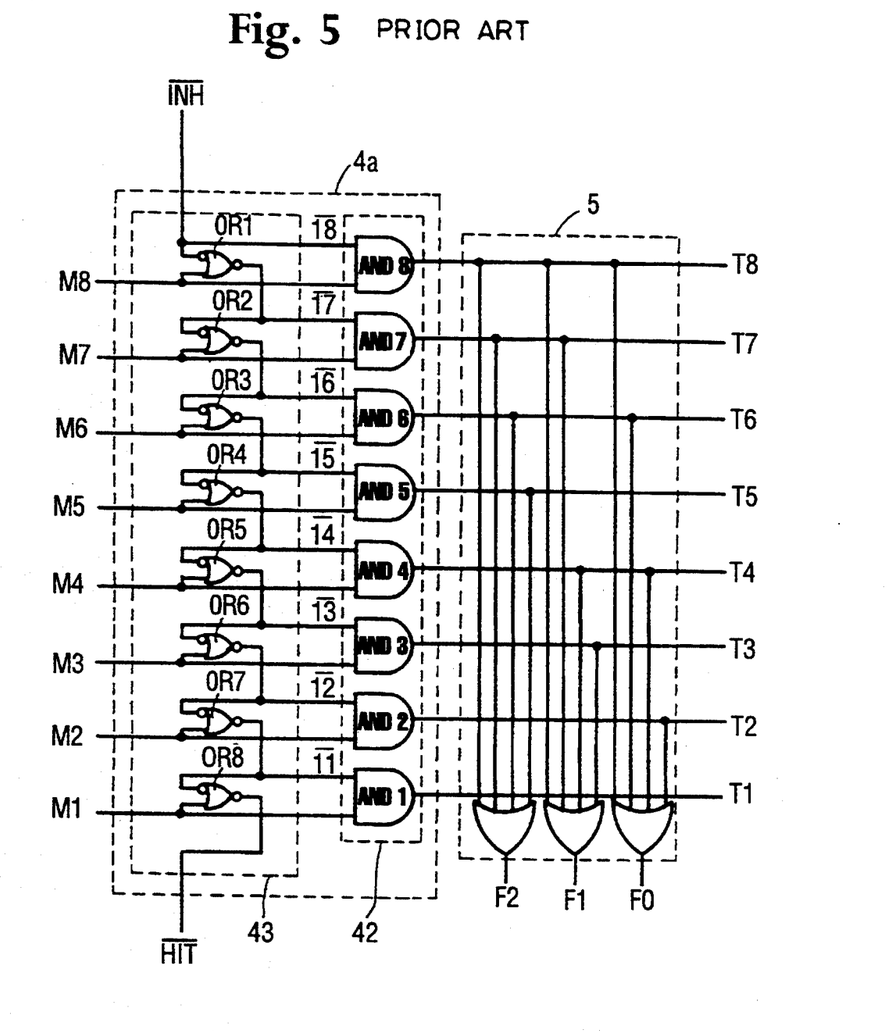
FIG. 5 shows another example of the conventional priority determining circuit and an encoding circuit.

FIG. 5 is a block diagram showing another example of the encoding circuit. The contention arbitrating circuit 43 of the encoding circuit 4a shown in FIG. 5 receives coincidence signals M1 to M8 by using OR gates OR1 to OR8 and outputs inhibiting signals $\overline{I1}$ to $\overline{I8}$. More specifically, when coincidence signal M4 is activated to "H" level, for example, the output of the OR gate OR5, that is, the inhibiting signal $\overline{I3}$ attains an "L" level, so that the AND gate AND3 whose priority level is lower by one is closed and the output of AND3 is at an "L" level. Therefore, even if the coincidence signal M3 attains to an "H" level, the arbitrating signal T3 output from AND gate AND3 attains an "L" level.

In a conventional priority determining circuit 4 shown in FIG. 4, block inhibiting signal $\overline{INH}$ is propagated through P channel MOS transistors P8–P1 connected in series. Therefore, it takes some time for arbitration signals T1–T8 to attain given values after coincidence signal Mj is applied to priority determining circuit 41. In the example shown in FIG. 4, when coincidence signal M8 is in an active state and the rest of coincidence signals M1–M7 are all in an inactive state, inhibiting signals 17 should be propagated sequentially from P channel MOS transistor P7 to a succeeding lower side. If the number of word is n, the signal should pass one N channel MOS transistor and n−1 P channel MOS transistors until block coincidence signal HIT is activated, that is, according to the embodiment shown in FIG. 4, the signal should pass one N channel MOS transistor and seven P channel MOS transistors. If the number of words in associative memory 1 is small, such delay in propagation is not a serious problem. However, since the capacity of the associative memory has been increased and the delay time of propagation becomes longer, there arises a problem that it takes long to determine priority.

SUMMARY OF THE INVENTION

Accordingly, one object of the present invention is to provide a priority determining circuit for an associative memory capable of shortening a time period from reception of a coincidence signal from an associative memory to conversion of the signal into a predetermined code.

According to another aspect, an object of the present invention is to provide a priority determining circuit of associative memory in which the area required by the circuit pattern can be efficiently used.

Briefly stated, the present invention provides a priority determining circuit responsive to coincidence between data stored in an associative memory and an externally applied retrieval data, sequentially selecting and outputting n coincidence signals output from addresses corresponding to word position where the coinciding data is stored in accordance with a prescribed priority, which receives coincidence signals of various levels of priority from the associative memory corresponding to the externally applied retrieval data and the coincidence data stored in the associative memory, a word position having the highest level of priority is detected corresponding to a coincidence between the retrieval data and the data stored in the associative memory, a coincidence signal corresponding to that word position having the highest level of priority is detected, and in response to the detected output, output of coincidence signals corresponding to all other word positions of lower levels of priority are inhibited simultaneously.

Therefore, according to the present invention, when the word position having the highest level of priority is detected, output of coincidence signals corresponding to all other word positions having lower levels of priority is inhibited simultaneously, and therefore the time required for converting the coincidence signal to a prescribed address code can be made shorter as compared with the prior art.

According to another aspect, a first circuit including a plurality of logic elements receiving n/2+1th to nth coincidence signals and a first inhibiting signal and outputting n/2+1th to nth inhibiting signals and a second block inhibiting signal, is provided arranged in an approximately triangular layout pattern, a second circuit, including a plurality of logic elements receiving 1st to n/2th coincidence signals and a second block inhibiting signal and outputting 1st to n/2th inhibiting signals and third block inhibiting signal is provided arranged in a triangular layout pattern which is complementary to the above mentioned triangular layout, and a third circuit determines whether or not n coincidence signals are to be output as n arbitrating signals, dependent on n inhibiting signals.

Therefore, according to the present invention, since the first and second circuits are formed in mutually complementary triangular layout pattern, the area of occupation can be efficiently used.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
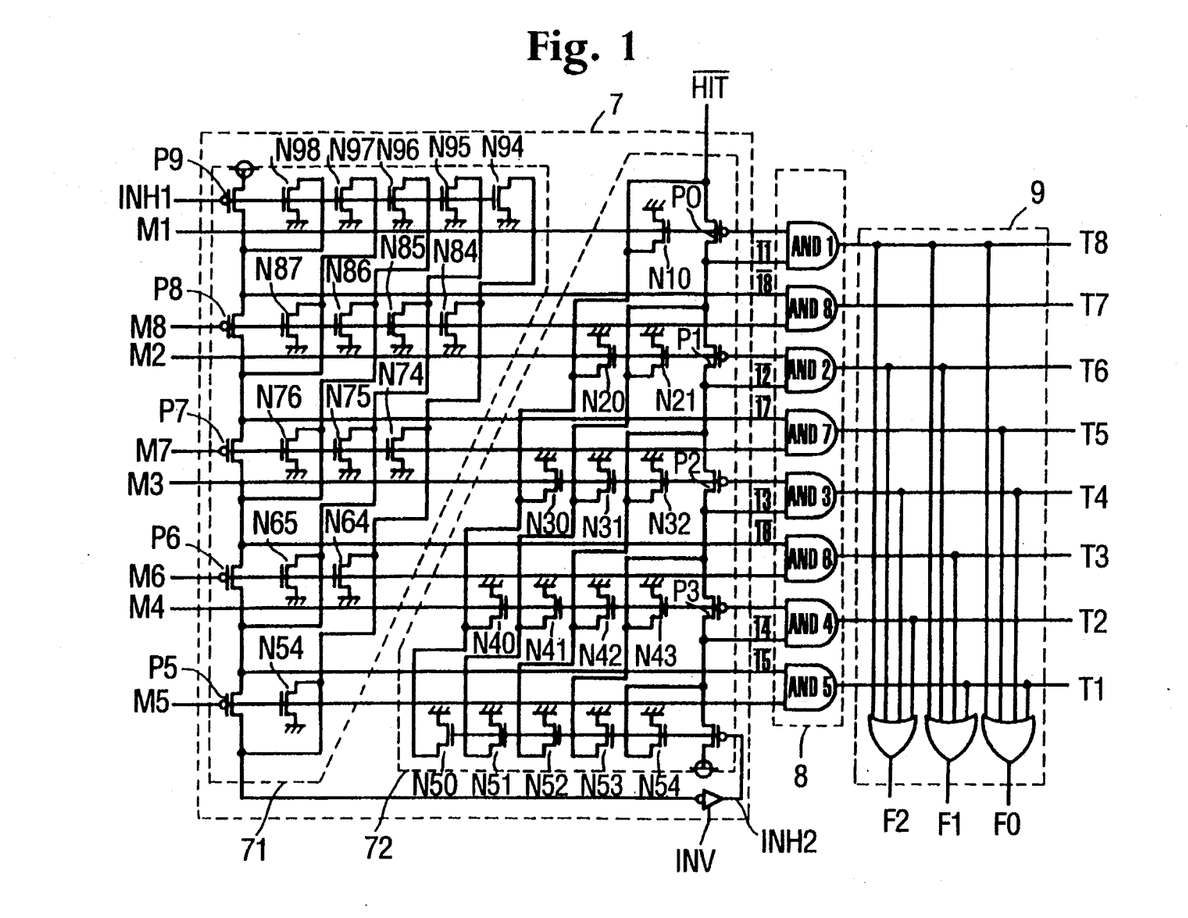
FIG. 1 shows a circuit structure of one embodiment of the present invention.

FIG. 1 is a diagram of a circuit configuration of a priority determining circuit according to one embodiment of the present invention.

In the embodiment, a circuit shown in FIG. 1 is used instead of priority determining circuit 4 and an encoding circuit 5 shown in FIG. 3, and associative memory 1 has a storage capacity of 8 words. Referring to FIG. 1, in priority determining circuit 6, n coincidence signals are divided into two subgroups, a higher half of n/2+1 through n signals (M5–M8 in this example) whose priority levels are higher and a lower half 1 through n/2 signals (M1–M4 in this example) whose priority levels are lower. The higher half undergoes arbitration by a contention arbitrating circuit 71 for a higher subgroup and the lower half undergoes arbitration by a contention arbitrating circuit 72 for a lower subgroup.

Contention arbitrating circuit 71 for a higher subgroup includes P channel MOS transistors P5–P9 and N channel MOS transistors N54, N64, N65, N74–N76, N84–N87, N94–N98. A coincidence signal M5 is applied to the gate of each of P channel MOS transistor P5 and N channel MOS transistor N54. A coincidence signal M6 is applied to the gate of each of P channel MOS transistor P6 and N channel MOS transistors N64, N65. A coincidence signal M7 is applied to the gate of each of P channel MOS transistor P7 and N channel MOS transistors N74–N76. A coincidence signal M8 is applied to the gate of each of P channel MOS transistor P8 and N channel MOS transistors N84–N87.

A first block inhibiting signal INH1 is applied to the gate of each of P channel MOS transistor P9 and N channel MOS transistors N94–N98. P channel MOS transistors P5–P9 are connected in series. The drain of P channel MOS transistor P9 is connected to a power supply. A second block inhibiting signal INH2 is provided from the source of P channel MOS transistor P5. The source of each of N channel MOS transistors N54, N64, N65, N74–N76, N84–N87, N94–N98 is connected to ground.

The drain of N channel MOS transistor N94 is connected to the drain of each of N channel MOS transistors N84, N74, N64, N54 and the source of P channel MOS transistor P5. The drain of N channel MOS transistor N95 is connected to the drain of each of N channel MOS transistors N85, N75, N65 and the drain of P channel MOS transistor P5. The drain of N channel MOS transistor N96 is connected to the drain of each of N channel MOS transistors N86, N76 and the drain of P channel MOS transistor P6. The drain of N channel MOS transistor N97 is connected to the drain of N channel MOS transistor N87 and the drain of P channel MOS transistor P7. The drain of N channel MOS transistor N98 is connected to the drain of P channel MOS transistor P8. The drain of each of P channel MOS transistors P5, P6, P7 and P8 is respectively connected to one input terminal of each of AND gates AND5–AND8, and each of coincidence signals M5–M8 is respectively applied to the other input terminal of each of AND gates AND5–AND8.

Contention arbitrating circuit 72 for a lower subgroup includes P channel MOS transistors P0–P4 and N channel MOS transistors N10, N20, N21, N30–N32, N40–N43, N50–N54. A coincidence signal M1 is applied to the gates of each of P channel MOS transistor P0 and N channel MOS transistor N10, and a coincidence signal M2 is applied to the gate of each of P channel MOS transistor P1 and N channel MOS transistor N20, N21. A coincidence signal M3 is applied to the gate of each of P channel MOS transistor P2 and N channel MOS transistor N30–N32. A coincidence signal M4 is applied to the gate of each of P channel MOS transistor P3 and N channel MOS transistors N40–N43. A second block inhibiting signal INH2 is inverted by an inverter INV and then applied to the gate of each of P channel MOS transistor P4 and N channel MOS transistors N50–N54. P channel MOS transistors P0–P4 are connected in series. The drain of P channel MOS transistor P4 is supplied with a power supply voltage. A block coincidence signal $\overline{HIT}$ is provided from the source of P channel MOS transistor P0.

The drain of N channel MOS transistor N50 is connected to the drain of each of N channel MOS transistors N40, N30, N20, N10 and the source of P channel MOS transistor P0. The drain of N channel MOS transistor N51 is connected to the drain of each of N channel MOS transistors N41, N31, N21 and the source of P channel MOS transistor P1. The drain of N channel MOS transistor N52 is connected to the drain of each of N channel MOS transistors N42, N32 and the source of P channel MOS transistor P2. The drain of N channel MOS transistor N53 is connected to the drain of N channel MOS transistor N43 and the source of P channel MOS transistor P3. The drain of N channel MOS transistor N54 is connected to the source of P channel MOS transistor P4. The drain of each of P channel MOS transistors P0, P1, P2 and P3 is respectively connected to one input terminal of each of AND gates AND1, AND2, AND3 and AND4. Each of coincidence signals M1, M2, M3 and M4 is respectively applied to the other input terminal of each of AND gates AND1, AND2, AND3 and AND4.

Arbitration signals T1–T8 which are outputs of AND gates AND1–AND8, respectively, of signal selecting circuit 8 are applied to an encoder 9. Encoder 9 includes three 4-input OR gates, receives arbitration signals T1–T8 and outputs encoding signals F0–F2.

Operation of priority determining circuit 7 shown in FIG. 1 will be described. When a coincidence signal $M_j$ ($5 \leq j \leq 8$ in this example) is in an active state, contention arbitrating circuit 71 for a higher subgroup simultaneously activates inhibiting signal $\overline{I_k}$ ($5 \leq K \leq j$ in this example) in the subgroup whose priority level is lower than that of the coincidence signal, and a second block inhibiting signal INH2 by means of a plurality of ($j-4$ in this example) N channel MOS transistors. When coincidence signal $M_j$ ($5 \leq j \leq 8$ in this example) is in an inactive state, an inhibiting signal $\overline{I_j}$ of the coincidence signal is propagated to an inhibiting signal $\overline{I_{j-1}}$ whose priority level is one lower than that of the inhibiting signal by means of P channel MOS transistors.

More specifically, when the coincidence signal M5 is activated to "H" level, N channel MOS transistor N54 is rendered conductive, and its drain attains to "L" level. This "L" level signal is inverted to "H" level by means of an inverter INV to be applied to the gates of N channel transistors N50 to N54 of the contention arbitrating circuit 72 of the lower subgroup, so that N channel MOS transistors N50 to N54 are rendered conductive. Consequently, inhibition signals $\overline{I1}$ to $\overline{I4}$ are activated to "L" level, and AND gates AND1 to AND4 are closed. Therefore, even if coincidence signals M1 to M4 lower than the coincidence signal M5 are activated "H", arbitrating signals T1 to T4 are not output, and the coincidence signal M5 is given priority to the coincidence signals M1 to M4 having lower levels. However, if the coincidence signals M5 and M8 are activated to "H" level simultaneously, N channel MOS transistors N84 to N87 are rendered conductive by the coincidence signal M8, and inhibiting signals $\overline{I1}$ to $\overline{I7}$ attains "L" level. Therefore, even if the coincidence signal M5 attains to "H" level, the arbitrating signal T5 is not output and coincidence signal M8 is given priority than M5.

When first block inhibiting signal INH1 is in an active state, all inhibiting signals ($\overline{I5}$–$\overline{I8}$) of the higher subgroup and second block inhibiting signal INH2 are simultaneously activated by a plurality of (5 in this example) N channel MOS transistors N94 to N98 which are rendered conductive. Conversely, when first block inhibiting signal INH1 is in an inactive state, an inhibiting signal ($\overline{I8}$ in this example) whose priority level is the highest in the subblock is inactivated by a P channel MOS transistor P9, which is rendered conductive. Consequently, AND gate AND 1 is closed, and arbitrating signal T1 is not output.

In contention arbitrating circuit 72 for a lower subgroup, when a coincidence signal $M_j$ ($1 \leq j \leq 4$ in this example) is in an active state, an inhibiting signal $\overline{I_k}$ ($1 \leq k \leq j$ in this example) of the subgroup whose priority level is lower than of the coincidence signal and block coincidence signal $\overline{HIT}$ are simultaneously activated by a plurality of (j in this example) N channel MOS transistors. Conversely, when a coincidence signal $M_j$ ($1 \leq j \leq 4$ in this example) is in an inactive state, an inhibiting signal $\overline{I_j}$ of the coincidence signal is propagated to an inhibiting signal $\overline{I_{j-1}}$ whose priority level is one lower than that of the inhibiting signal by a P channel MOS transistor.

More specifically, when a coincidence signal M3 is at the "H" level and is active, N channel MOS transistors N30 to N32 are rendered conductive, and inhibiting signals $\overline{I1}$ and $\overline{I2}$ having lower level of priority than coincidence signal M3 and block coincidence signal $\overline{HIT}$ are activated to "L" level. Therefore, even if coincidence signals M1 and M2 are activated to "H" level, arbitrating signals T1 and T2 are not output.

When second block inhibiting signal INH2 is in an active state, all inhibiting signals ($\overline{I1}$-$\overline{I3}$ in this example) of the lower subgroup and block coincidence signal $\overline{HIT}$ are simultaneously activated by a plurality of (5 in this example) N channel MOS transistors. Conversely, when second block inhibiting signal INH2 is in an inactive state, an inhibiting signal (in this example $\overline{I4}$) whose priority level is the highest of the subblock is inactivated.

In priority determining circuit 7 shown in FIG. 1, coincidence signals M5-M8 of a higher half subgroup are arranged in ascending order and coincidence signals M1-M4 of a lower half subgroup are arranged in descending order. Since a coincidence signal whose priority level is high requires more N channel MOS transistors to activate inhibiting signals whose priority levels are lower than the priority level of the coincidence signal, layout patterns of contention arbitrating circuit 71 for a higher half subgroup and contention arbitrating circuit 72 for a lower half subgroup are triangular. Contention arbitrating circuit 71 for a higher half subgroup and a contention arbitrating circuit 72 for a lower half subgroup are arranged to make a shape of a combination of a triangle and a complementary triangle correspondingly to the arrangement of the coincidence signals, and therefore such an arrangement helps to reduce a waste of area resulting from the shape of the triangular layout pattern.

Figure 2:
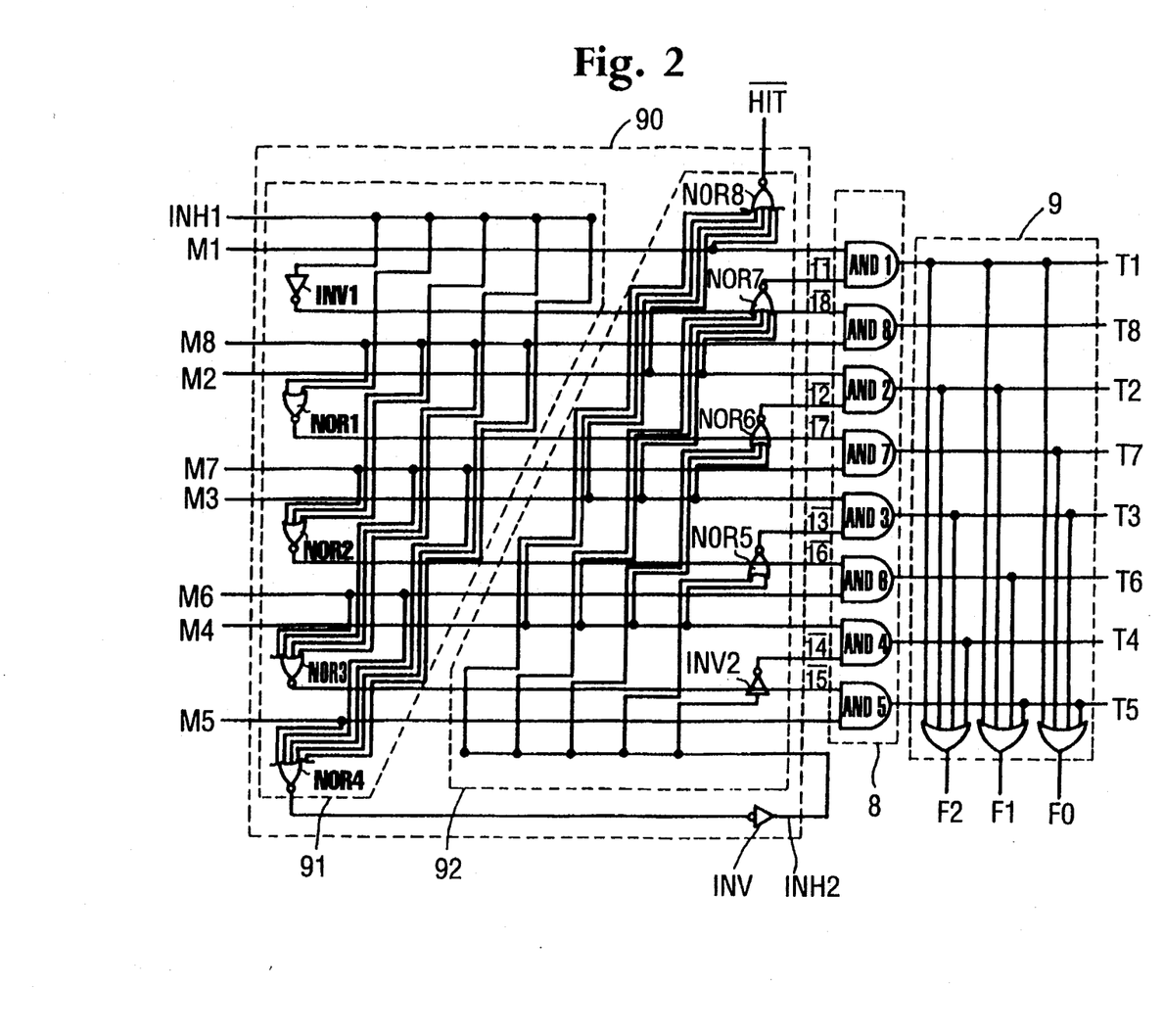
FIG. 2 is a block diagram showing another embodiment of the present invention.

FIG. 2 is a block diagram showing another embodiment of the present invention. In the embodiment shown in FIG. 1, the priority determining circuit 7 is formed by combining N channel MOS transistors and P channel MOS transistors. The priority determining circuit 9 shown in FIG. 2 is formed by inverters INV1 and INV2 and NOR gates NOR1 to NOR8. More specifically, the upper subgroup contention arbitrating circuit 91 includes an inverter INV1 and NOR gates NOR1 to NOR4, which inverter INV1 inverts inhibiting signal INH1 to apply the same to one input of an AND gate AND8. NOR gate NOR1 receives as inputs coincidence signal M8 and inhibiting signal INH1 and applies the same to one input of an AND gate AND7. NOR gate NOR2 receives coincidence signals M7 and M8 and inhibiting signal INH1 and applies its output to one input of an AND gate AND6. NOR gate NOR3 applies coincidence signals M6, M7, M8 and inhibiting signal INH1 to one input of an AND gate AND4. NOR gate NOR4 receives coincidence signals M5, M6, M7 and M8 and inhibiting signal INH1 and applies its output to inverter INV.

Lower subgroup contention arbitrating circuit 92 includes an inverter INV2 and NOR gates NOR5 to NOR8. Inverter INV2 inverts inhibiting signal INH2 and applies the same to one input of an AND gate AND4, NOR gate NOR5 receives coincidence signal M4 and inhibiting signal INH2 and applies its output to one input of an AND gate 3. NOR gate NOR6 receives coincidence signals M3 and M4 and inhibiting signal INH2, and applies its output to one input of an AND gate AND2. NOR gate 7 receives coincidence signals M2, M3, and M4 and inhibiting signal INH2, and applies its output to an AND gate AND1. NOR gate NOR8 receives coincidence signals M1, M2, M3 and M4 and inhibiting signal INH2, and outputs the same as an input coincidence signal $\overline{HIT}$.

The operation of the priority determining circuit 90 shown in FIG. 2 will be described. When coincidence signal M6 is activated, for example, this coincidence signal M6 is applied to NOR gates NOR3 and NOR4, the output from NOR gate NOR3, that is inhibiting signal $\overline{I5}$ attains to "L" level, and AND gate AND5 is closed. The output from the NOR gate NOR4 attains "L" level, which is inverted by the inverter INV, and block inhibiting signal INH2 attains to "H". Thus output from inverter INV2 and from NOR gates NOR5 to NOR8 attain "L" level, AND gates AND1 to AND4 are closed, so that arbitrating signals T1 to T5 are not output. Namely, when coincidence signal M6 is activated, it is given priority than the coincidence signals M1 to M5 having lower levels of priority.

As described above, according to the embodiment of the present invention, a coincidence signal in an active state activates simultaneously a plurality of inhibiting signals whose priority levels are lower than the priority level of the coincidence signal, so that propagation delay of the inhibiting signals can be reduced, and therefore time required for the coincidence signal to be converted into a predetermined address code can be shortened in comparison with a conventional case. Also, by arranging first and second circuit elements to make a shape of combination of a triangle and an inverse triangle, a waste of area can be minimized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A priority determining circuit responsive to coincidence between data stored in an associative memory and externally applied retrieval data for sequentially selecting and outputting n coincidence signals output from an address corresponding to a word position where the coinciding data is stored according to predetermine priority levels, comprising:

means responsive to coincidence of data stored in said associative memory and the externally applied retrieval data for receiving coincidence signals of various priorities;

means for detecting a word position of highest priority from among said coincidence of said retrieval data with data stored in said associative memory, and outputting one or more inhibit signals and a coincidence signal corresponding to said word position of highest priority; and means for applying over parallel paths the one or more inhibit signals to all word positions of lower priority, in response to detection output of said detecting means.

2. The priority determining circuit of an associative memory according to claim 1, wherein said detecting means comprises a first circuit receiving k+1th to nth coincidence signals and a first block inhibiting signal and outputting k+1th to nth inhibiting signals and a second block inhibiting signal;

a second circuit receiving 1st to kth coincidence signals and said second block inhibiting signal and outputting 1st to kth inhibiting signals and a third block inhibiting signals; and a third circuit for determining whether or not said n coincidence signals are to be output as an arbitrating signals, in response to said n inhibiting signals.

3. The priority determining circuit of an associative memory according to claim 2, wherein said first circuit includes a first activating and inactivating means responsive to said first block inhibiting signal attaining an active state for simultaneously activating said second block inhibiting signal and k+1th to nth inhibiting signals, and responsive to said first block inhibiting signal attaining an inactive state for inactivating said nth inhibiting signal; and said second circuit includes a second activating and inactivating means responsive to said second block inhibiting signal attaining an active state for simultaneously activating said third block inhibiting signal and 1st to kth inhibiting signals, and responsive to said second block inhibiting signal attaining an inactive state, inactivating kth inhibiting signals.

4. The priority determining circuit of an associative memory according to claim 2, wherein said first circuit includes first transmitting means responsive to ith coincidence signal (k+2≦i≦n) attaining an active state for simultaneously activating said second block inhibiting signal and k+1th to i−1th inhibiting signals, and responsive to said ith coincidence signal k+2≦i≦n) attaining an inactive state for transmitting the state of the ith inhibiting signal to the i−1th inhibiting signal, and second transmitting means responsive to k+1th coincidence signal attaining an active state for activating said second block inhibiting signal and responsive to said k+1th coincidence signal attaining an inactive state, for transmitting the state of k+1th inhibiting signal to said second block inhibiting signal; and said second circuit includes third transmitting means responsive to jth coincidence signal (2≦j±k) attaining an active state, for simultaneously activating said third block inhibiting signal and 1st to j−1th inhibiting signals, and responsive to said jth coincidence signal (2≦j≦k) attaining an inactive state, for transmitting the state of the jth inhibiting signal to the j−1th inhibiting signal, and fourth transmitting means responsive to 1st coincidence signal attaining an active state for activating said third block inhibiting signal, and responsive to said 1st coincidence signal attaining an inactive state, for transmitting the state of the 1st inhibiting signal to said third block inhibiting signal.

5. The priority determining circuit according to claim 2, wherein said k+1th to nth coincidence signals are arranged in ascending order, and said 1st to kth coincidence signals are arranged in descending order, and said first circuit is arranged in approximately triangular layout pattern and said second circuit is arranged in a triangular layout pattern which is complementary to said first triangular layout pattern.

6. A priority determining circuit responsive to a coincidence between data stored in an associative memory and externally applied retrieval data for sequentially selecting and outputting n coincidence signals output from an address corresponding to a word position storing coinciding data in accordance with a predetermined priority levels, comprising:

a first circuit including a plurality of logic elements receiving k+1th to nth coincidence signals and a first inhibiting signal and outputting k+1th to nth inhibiting signals and second block inhibiting signal, arranged in an approximately triangular layout pattern, a second circuitry including a plurality of logic elements receiving 1st to kth coincidence signals and said second block inhibiting signal and outputting 1st to kth inhibiting signals and a third block inhibiting signal, arranged in a triangular layout which is complementary to said triangular layout, and a third circuitry for determining whether or not said n coincidence signals are to be output as n arbitrating signals, in response to said n inhibiting signals.

* * * * *